United States Patent
Wang

(10) Patent No.: US 12,119,078 B2
(45) Date of Patent: Oct. 15, 2024

(54) DATA PROCESSING CIRCUIT AND SEMICONDUCTOR MEMORY DIVIDED INTO SEGMENTS

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 175 days.

(21) Appl. No.: 17/806,248

(22) Filed: Jun. 9, 2022

(65) Prior Publication Data

US 2023/0206965 A1 Jun. 29, 2023

(30) Foreign Application Priority Data

Dec. 29, 2021 (CN) .......................... 202111638471.1

(51) Int. Cl.
*G11C 7/10* (2006.01)
(52) U.S. Cl.
CPC .......... *G11C 7/1039* (2013.01); *G11C 7/1063* (2013.01); *G11C 7/109* (2013.01)

(58) Field of Classification Search
CPC ..... G11C 7/1039; G11C 7/1063; G11C 7/109; G11C 7/1057; G11C 7/1069; G11C 5/04; Y02D 10/00; G06F 3/061; G06F 3/0629; G06F 3/0688
See application file for complete search history.

(56) References Cited

U.S. PATENT DOCUMENTS

2002/0030509 A1* 3/2002 Sakata ........... H03K 19/018528
326/83

FOREIGN PATENT DOCUMENTS

CN 207304523 U 5/2018

* cited by examiner

*Primary Examiner* — Sultana Begum
(74) *Attorney, Agent, or Firm* — Syncoda LLC; Feng Ma

(57) ABSTRACT

A data processing circuit includes a primary transmission path, multiple secondary transmission paths and multiple storage arrays which share the primary transmission path. Each storage array includes at least two sub-arrays, and the secondary transmission path is formed between each sub-array and the primary transmission path, and the sub-array transmits a signal through the secondary transmission path and the primary transmission path.

18 Claims, 12 Drawing Sheets

DATA PROCESSING CIRCUIT AND SEMICONDUCTOR MEMORY DIVIDED INTO SEGMENTS

CROSS-REFERENCE TO RELATED APPLICATION

This application claims priority to Chinese Patent Application No. 202111638471.1 filed on Dec. 29, 2021, the disclosure of which is hereby incorporated by reference in its entirety.

BACKGROUND

With the continuous development of semiconductor technology, the demand for signal quality of memory devices is getting higher and higher. In a Dynamic Random Access Memory (DRAM), a large number of storage arrays are arranged to store data, a signal is transmitted from the outside to the storage array through a set data transmission path, or a signal is transmitted from the storage array to the outside through the set data transmission path. However, in the data transmission process, there is a problem that a data signal transmitted early conflicts with a data signal transmitted later, which adversely affects a signal margin and other performance.

SUMMARY

The present disclosure relates to the technical field of integrated circuits, and in particular to a data processing circuit and a semiconductor memory.

The present disclosure provides a data processing circuit and a semiconductor memory, which can improve signal transmission quality and improve a signal margin.

A technical solution of the present disclosure is implemented as follows.

A first aspect of an embodiment of the present disclosure provides a data processing circuit. The data processing circuit includes a primary transmission path, multiple secondary transmission paths and multiple storage arrays. The multiple storage arrays share the primary transmission path. Each storage array includes at least two sub-arrays, and the secondary transmission path is formed between each sub-array and the primary transmission path, and the sub-array transmits a signal through the secondary transmission path corresponding to the sub-array and the primary transmission path.

A second aspect of an embodiment of the present disclosure provides a semiconductor memory, which may include the data processing circuit.

The data processing circuit includes a primary transmission path, multiple secondary transmission paths and multiple storage arrays. The multiple storage arrays share the primary transmission path. Each storage array includes at least two sub-arrays, and the secondary transmission path is formed between each sub-array and the primary transmission path, and the sub-array transmits a signal through the secondary transmission path corresponding to the sub-array and the primary transmission path.

DETAILED DESCRIPTION

The technical solutions in the embodiments of the present invention are clearly and completely described below in combination with the accompanying drawings in the embodiments of the present invention. It is understandable that the specific embodiments described here are used only to explain the present disclosure and not to limit it. It is to be noted that for ease of description, only those parts relevant to the present disclosure are shown in the accompanying drawings.

Unless otherwise defined, all technical and scientific terms in the specification have the same meaning as those skilled in the art, belonging to the present disclosure, usually understand. Terms used in the specification are only used for describing the purpose of the embodiments of the present disclosure, but not intended to limit the present disclosure.

"Some embodiments" involved in the following descriptions describes a subset of all possible embodiments. However, it can be understood that "some embodiments" may be the same subset or different subsets of all the possible embodiments, and may be combined without conflicts.

It should be pointed out that term "first/second/third" involved in the embodiments of the present disclosure is only used for distinguishing similar objects and does not represent a specific sequence of the objects. Understandably, "first/second/third" may be interchanged to specific sequences or orders if permitted, to implement the embodiments of the present disclosure described herein in sequences except the illustrated or described sequence herein.

In addition, in the embodiments of the present disclosure, the concepts of "row" and "column" are relative and do not form a limit to the embodiments of the present disclosure. In other words, row and column can be switched from each other in the subsequent description of matrix.

Figure 1:
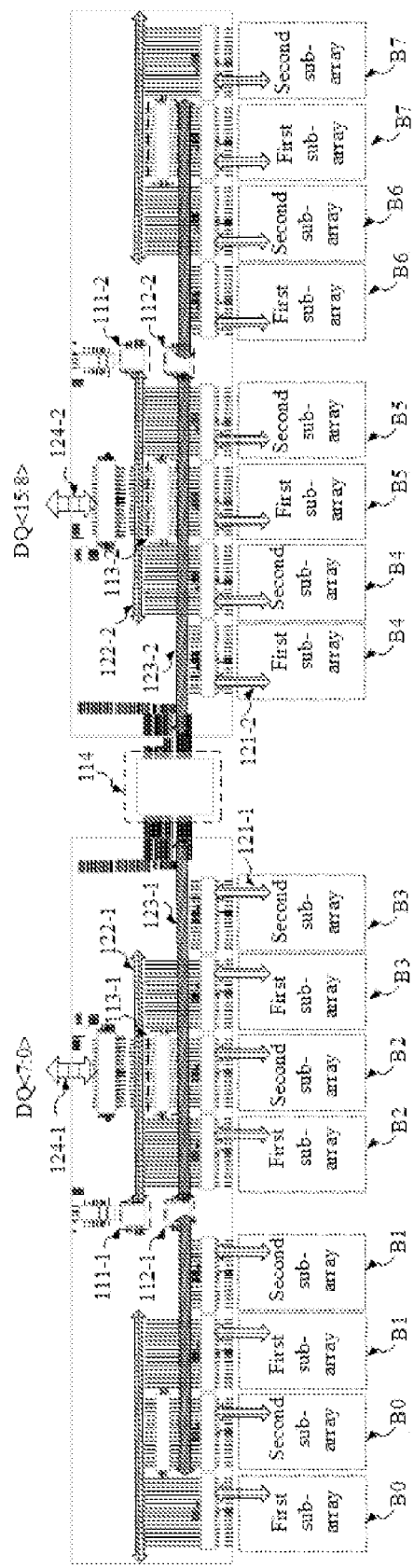
FIG. 1 is a schematic diagram of an application scenario of a signal transmission path.

Referring to FIG. 1 which a schematic diagram of an application scenario of a signal transmission path, the application scenario includes two parts arranged symmetrically. The first part includes a first data port for receiving a lower-byte signal (denoted as DQ<7:0>), a storage array B0, a storage array B1, a storage array B2, a storage array B3 and a signal transmission path. The second part includes a second data port for receiving an upper-byte signal (denoted as DQ<15:8>), a storage array B4, a storage array B5, a storage array B6, a storage array B7 and a signal transmission path. Here, each storage array includes two sub-arrays, that is, a first sub-array and a second sub-array. The signal transmission path includes a first transmission module (for example, the first transmission module 111-1 or the first transmission module 111-2 in FIG. 1), a second transmission module (for example, the second transmission module 112-1 or the first transmission module 112-2 in FIG. 1), a third transmission module (for example, the third transmission module 113-1 or the third transmission module 113-2 in FIG. 1), a fourth transmission module 114, a first data bus (for example, the first data bus 121-1 or the second data bus 121-2 in FIG. 1), a second data bus (for example, the second data bus 122-1 or the second data bus 122-2 in FIG. 1), a third data bus (for example, the third data bus 123-1 or the third data bus 123-2 in FIG. 1), and a fourth data bus (for example, the fourth data bus 124-1 or the fourth data bus 124-2 in FIG. 1). In FIG. 1, the first part and the second part arranged symmetrically share a fourth transmission module 114, and the third data bus 123-1 in the first part and the third data bus 123-2 in the second part are both connected to the fourth transmission module 114. In addition, the first transmission module is configured to realize connection and control of two second data buses in the part, the second transmission module is configured to realize connection and control of two third data buses in the part, and the third transmission module is configured to realize connection and control of the second data bus and the third data bus in the part. It is to be understood that some duplicate data buses and duplicate control modules in FIG. 1 are not shown with labels, but may be understood by the filled patterns and specific shapes in FIG. 1.

A signal to be transmitted may be a 8-byte signal (which is received from only one data port) or a 16-byte signal (which is received from both the first data port and the second data port). Exemplarily, according to industry standards, a 8-byte data signal DQ<7:0> may be transmitted from the outside to the first sub-array or the second sub-array, or transmitted from the first sub-array or the second sub-array to the outside. For a 16-byte data signal DQ<15:0>, the lower-byte signal DQ<7:0> is transmitted from the outside to the first sub-array of a storage array, and the upper-byte signal DQ<15:8> is transmitted from the outside to the second sub-array of the storage array. Alternatively, the lower-byte signal DQ<7:0> is transmitted from the first sub-array of a storage array to the outside, and the upper-byte signal DQ<15:8> is transmitted from the second sub-array of the storage array to the outside.

Figure 2A:
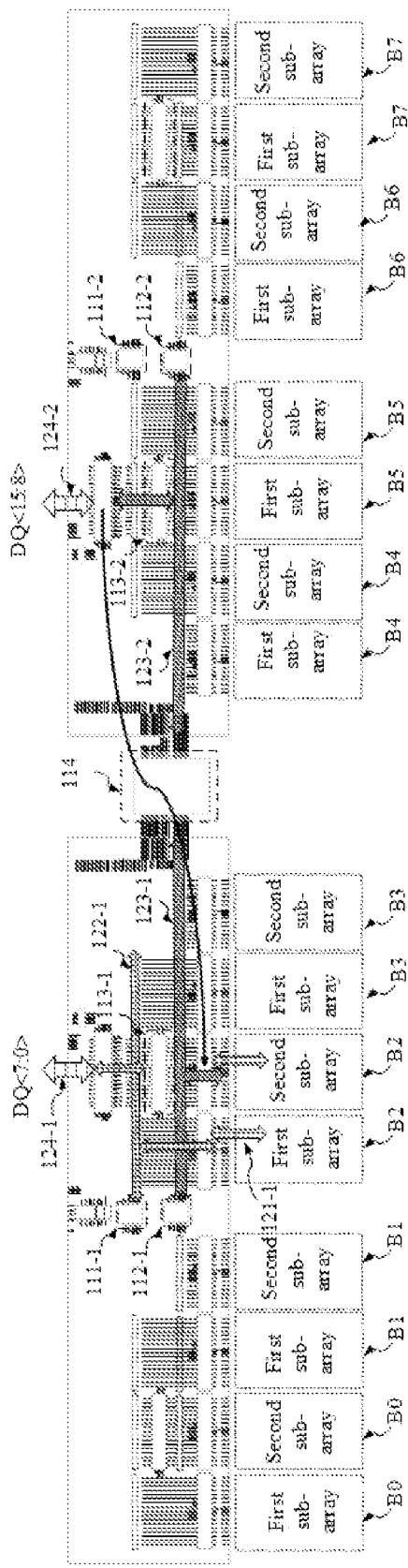
FIG. 2A is a schematic diagram of an application scenario of another signal transmission path.

In the first scenario, assuming that the 16-byte data signal (denoted as DQ<15:0>) is transmitted from the outside to the storage array B2. As shown in FIG. 2A, the transmission path of the lower-byte signal DQ<7:0> includes the fourth data bus 124-1, the second data bus 122-1, the first data bus 121-1 and the first sub-array in the storage array B2, and the transmission path of the upper-byte signal DQ<15:8> includes the fourth data bus 124-2, the third data bus 123-2, the fourth transmission module 114, the third data bus 123-1, the first data bus 121-1 and the second sub-array in the storage array B2. As shown in FIG. 2A, the transmission path of the lower-byte signal DQ<7:0> is apparently shorter than that of the high-level signal DQ<15:8>.

Figure 2B:
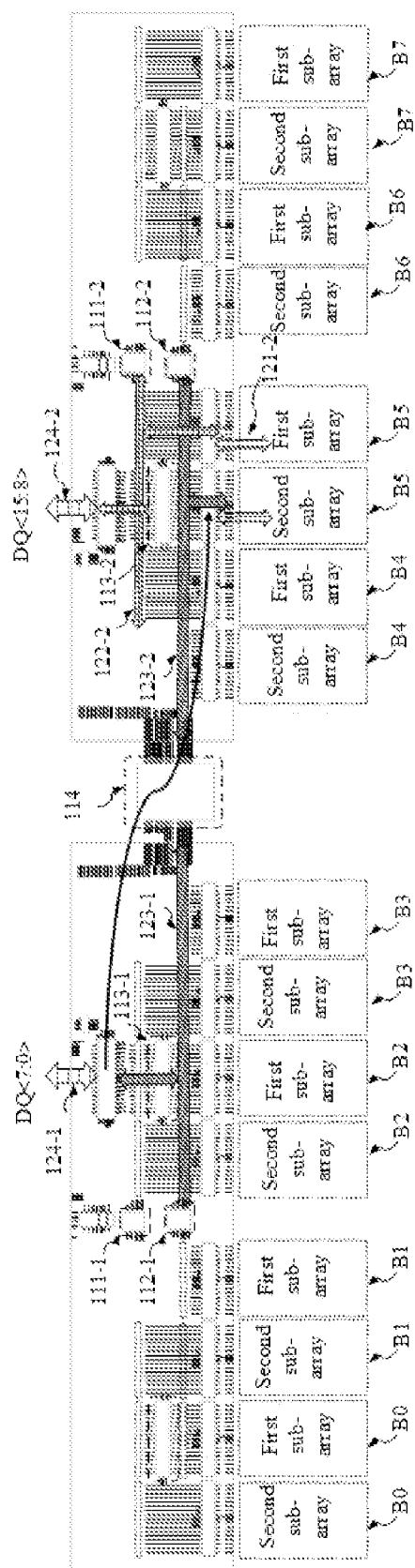
FIG. 2B is a schematic diagram of an application scenario of yet another signal transmission path.

In the second scenario, assuming that the 16-byte data signal (denoted as DQ<15:0>) is transmitted from the outside to the storage array B5. As shown in FIG. 2B, the transmission path of the lower-byte signal DQ<7:0> includes the fourth data bus 124-1, the third data bus 123-1, the fourth transmission module 114, the third data bus 123-2, the first data bus 121-2 and the first sub-array in the storage array B5, and the transmission path of the upper-byte signal DQ<15:8> includes the fourth data bus 124-2, the second data bus 122-2, the first data bus 121-2 and the second sub-array in the storage array B5. As shown in FIG. 2B, the transmission path of the lower-byte signal DQ<7:0> is apparently longer than that of the high-level signal DQ<15:8>.

With reference to FIG. 2A and FIG. 2B, assuming that the signal transmission path experiences the first scenario and then the second scenario, it is needed to receive the upper-byte signal DQ<15:8> of the first signal and the lower-byte signal DQ<7:0> of the second signal successively at any position at one side of the fourth transmission module 114 on the third data bus 123-1. However, taking the second part on the right of FIG. 2A and FIG. 2B as an example, the upper-byte signal DQ<15:8> of the first signal received by the third data bus 123-1 of this part is transmitted through a long path, while the lower-byte signal DQ<7:0> of the second data signal is transmitted through a short path. Therefore, the upper-byte signal DQ<15:8> of the first signal will be truncated by the lower-byte signal DQ<7:0> of the second data signal, affecting the signal margin of the first data signal.

The defect of signal truncation occurring in a data writing operation is described above, and a similar defect also occurs in a data reading operation, which can be understood by reference with that in the data writing operation and will not be repeated here. It is to be noted that in a data transmission process, a certain interval should be formed between different data signals that are transmitted adjacently, to avoid the influence of the later data transmission on the data transmitted early. In other words, in order to ensure the validity of the data signal transmitted earlier, different data signals transmitted adjacently are controlled to have a certain time interval between them, so as to ensure that the earlier data sampled at any time of a transmission period of the data signal transmitted early is valid data. If the earlier data signal is affected by the later data signal, an error may occur in the latter part of the transmission period of the earlier data signal. If the earlier data signal is transmitted into a target structure in the latter part of the transmission period, the target structure may actually receive the prior data signal with an error. The above mentioned influence of the data signal transmitted later on the data signal transmitted earlier is called truncation.

In short, for the current semiconductor memory, a sub-array may transmit signals to the outside through multiple paths with different lengths, which causes the previous signal to be truncated by the next signal, affecting the signal margin.

Based on this, an embodiment of the present disclosure provides a data processing circuit. The data processing circuit includes a primary transmission path, multiple secondary transmission paths and multiple storage arrays. The multiple storage arrays share the primary transmission path. Each storage array includes at least two sub-arrays, and the secondary transmission path is formed between each sub-array and the primary transmission path. The sub-array transmits a signal through the secondary transmission path corresponding to the sub-array and the primary transmission path. In this way, the time at which a signal reaches a location in the transmission path is fixed, which can improve the problem that the signal is truncated during transmission and improve the signal margin.

The embodiments of the present disclosure are elaborated below in combination with the accompanying drawings.

Figure 3:
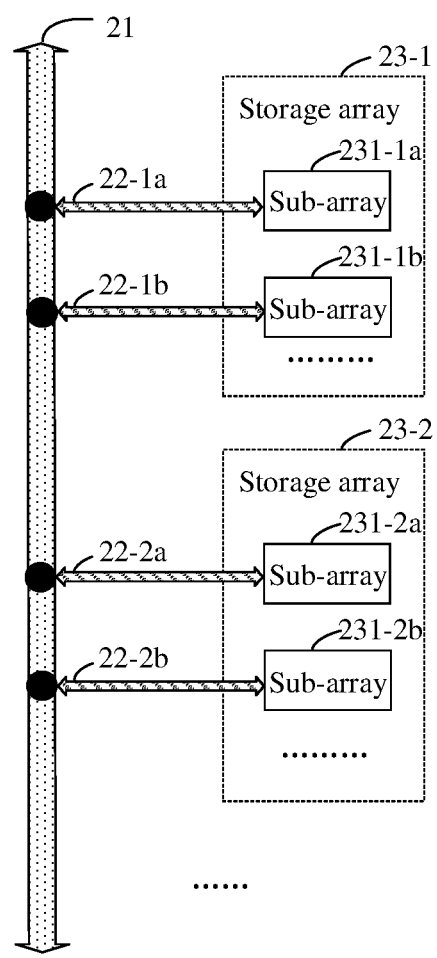
FIG. 3 is a schematic structural diagram of a data processing circuit provided by an embodiment of the present disclosure.

In an embodiment of the present disclosure, FIG. 3 is a schematic structural diagram of a data processing circuit 20 provided by the embodiment of the present disclosure. As illustrated in FIG. 3, the data processing circuit 20 may include a primary transmission path 21, multiple secondary transmission paths (such as the secondary transmission path 22-1a, the secondary transmission path 22-1b, the secondary transmission path 22-2a, the secondary transmission path 22-2b in FIG. 3), and multiple storage arrays (such as the storage array 23-1, the storage array 23-2 in FIG. 3).

Each storage array includes at least two sub-arrays. For example, the storage array 23-1 in FIG. 3 may include at least the sub-array 231-1a and the sub-array 231-1b, and the storage array 23-2 in FIG. 3 may include at least the sub-array 231-2a and the sub-array 231-2b. In this way, the secondary transmission path is formed between each sub-array and the primary transmission path, so that the sub-array transmits a signal through the secondary transmission path corresponding to the sub-array and the primary transmission path. For example, a secondary transmission path 22-1a is formed between the sub-array 231-1a and the primary transmission path 21, so that the sub-array 231-1a transmits a signal to the primary transmission path 21 through the secondary transmission path 22-1a corresponding to the sub-array 231-1a. A secondary transmission path 22-1b is formed between the sub-array 231-1b and the primary transmission path 21, so that the sub-array 231-1b transmits a signal through the secondary transmission path 22-1b corresponding to the sub-array 231-1b and the primary transmission path 21.

It is to be noted that the data processing circuit 20 provided by the embodiment of the present disclosure is applied to a semiconductor memory, for example, a DRAM, a Static Random-Access Memory (SRAM), a Synchronous Dynamic Random-Access Memory (SDRAM), which is no limited in the embodiments of the present disclosure.

As shown in FIG. 3, the primary transmission path, the secondary transmission paths and the storage arrays are comprised in the data processing circuit 20 in which one primary transmission path (the primary transmission path 21 in FIG. 3), multiple secondary transmission paths (the secondary transmission path 22-1a, the secondary transmission path 22-1b, the secondary transmission path 22-2a, the secondary transmission path 22-2b and so on in FIG. 3), and multiple storage arrays (the storage array 23-1, the storage array 23-2 and so on in FIG. 3) are arranged. Each storage array may consist of multiple sub-arrays, and a sub-array is connected to the primary transmission path through a secondary transmission path. That is, each sub-array has a separate secondary transmission path, but these sub-arrays share the primary transmission path.

It is to be noted that in the embodiments of the present disclosure, all secondary transmission paths should have the same length, but this is not a limitation. That is because a transmission speed of a signal in the transmission path is very high, even if the lengths of different secondary transmission paths are different, it can be considered that the time taken for transmitting the signal in the secondary transmission paths with different lengths is identical. In addition, when the length of the secondary transmission path is shorter than that of the primary transmission path, the transmission time in the secondary transmission path may be ignored compared with that in the primary transmission path. In addition, some buffers may be arranged on both the primary transmission path and the secondary transmission path to ensure a high signal transmission speed.

In this way, for the data writing operation, a signal is transmitted to the sub-array from the outside and through the primary transmission path and the secondary transmission path. According to the above structure of the data processing circuit, the time taken for transmitting a signal to a fixed location in the primary transmission path from the outside is fixed, and the time taken for transmitting the signal to a fixed location in the secondary transmission path from the outside is also fixed, so there is no defect of signal truncation in the primary transmission path or the secondary transmission path.

For the data reading operation, a signal is transmitted to the outside from the sub-array and through the secondary transmission path and the primary transmission path. According to the above structure of the data processing circuit, the time taken for transmitting a signal to a fixed location in the secondary transmission path from the sub-array is fixed, so there is no defect of signal truncation in the secondary transmission path. Further, because transition points of the primary transmission path corresponding to different sub-arrays in the same storage array are close to each other, the time taken for transmitting a signal to reach a fixed location in the primary transmission path from different sub-arrays may also be considered fixed approximately, and there is no defect of signal truncation in the primary transmission path.

In short, in the embodiments of the present disclosure, different sub-arrays in the same storage array transmit data signals with the outside through the transmission paths with approximately the same length, which can improve the problem of signal truncation and improve the signal margin.

It is to be noted that FIG. 3 shows 4 secondary transmission paths and 2 storage arrays, but in actual application scenarios, there may be more or less secondary transmission paths and storage arrays. Also, in FIG. 3, one storage array consists of two sub-arrays, but there may be more or less sub-arrays in actual application scenarios. In addition, in FIG. 3, all sub-arrays are arranged on one side of the primary transmission path, but there is no limitation on the location of the sub-array 231, for example, the sub-arrays may be arranged on different sides of the primary transmission path. In other words, FIG. 3 illustrates only a specific structure for facilitating the understanding of the above technical solution, and all characteristics in FIG. 3 that are not defined by the above description do not play a limiting role.

Figure 4:
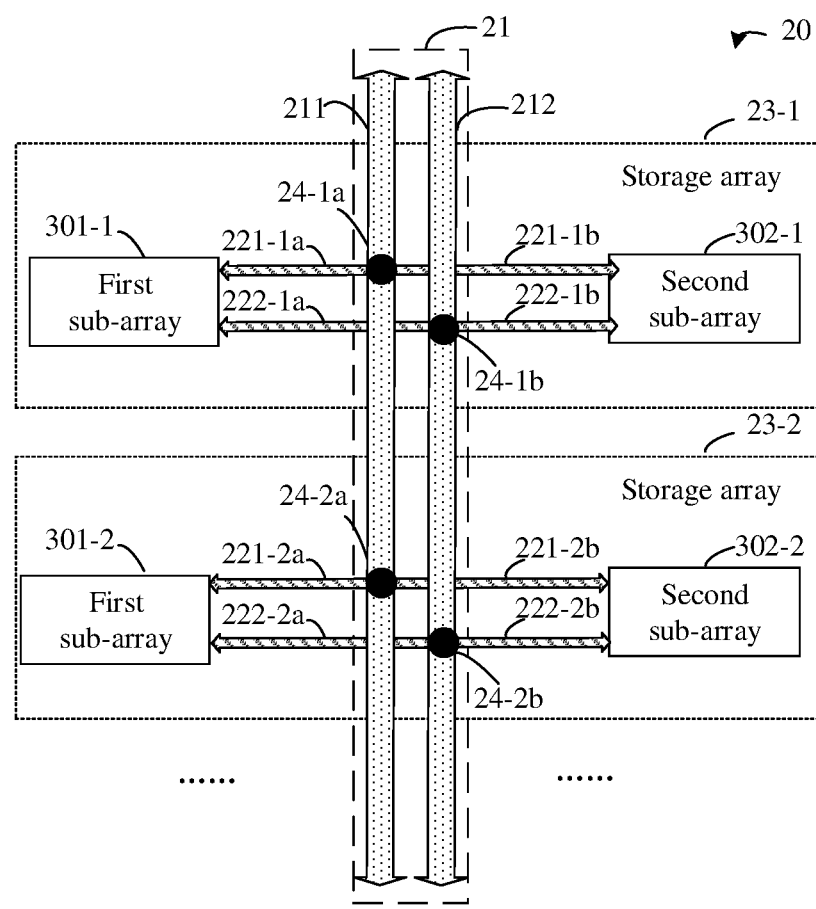
FIG. 4 is a schematic structural diagram of another data processing circuit provided by an embodiment of the present disclosure.

Based on FIG. 3, as illustrated in FIG. 4, taking a case that each storage array includes a first sub-array and a second sub-array as an example, another structure diagram of the data processing circuit 20 is given.

As illustrated in FIG. 4, each storage array includes the first sub-arrays (such as the first sub-array 301-1, the first sub-array 301-2 in FIG. 3) and the second sub-arrays (such as the second sub-array 302-1, the second sub-array 302-2 in FIG. 3), and the primary transmission path 21 passes through an intermediate area between the first sub-array and the second sub-array.

The primary transmission path 21 may include a first primary transmission path 211 and a second primary transmission path 212. The first primary transmission path 211 is close to the first sub-array, and the second primary transmission path 212 is close to the second sub-array.

Correspondingly, the secondary transmission paths may include first secondary transmission paths (such as the first secondary transmission path 221-1a, the first secondary transmission path 221-1b, the first secondary transmission path 221-2a, the first secondary transmission path 221-2b in FIG. 4) and second secondary transmission paths (such as the second secondary transmission path 222-1a, the second secondary transmission path 222-1b, the second secondary transmission path 222-2a, the second secondary transmission path 222-2b in FIG. 4). The first sub-array forms the first secondary transmission path with the first primary transmission path 211, and the first sub-array also forms the second secondary transmission path with the second primary transmission path. The second sub-array forms the first secondary transmission path with the first primary transmission path, and the second sub-array also forms the second secondary transmission path with the second primary transmission path.

That is, in the storage array 23-1, the first sub-array 301-1 forms the first secondary transmission path 221-1a with the first primary transmission path 211, and forms the second secondary transmission path 222-1a with the second primary transmission path 212. The second sub-array 302-1 forms the first secondary transmission path 221-1b with the first primary transmission path 211, and forms the second secondary transmission path 222-1b with the second primary transmission path 212. Similarly, in the storage array 23-2, the first sub-array 301-2 forms the first secondary transmission path 221-2a with the first primary transmission path 211, and forms the second secondary transmission path 222-2a with the second primary transmission path 212. The second sub-array 302-2 forms the first secondary transmission path 221-2b with the first primary transmission path 211, and forms the second secondary transmission path 222-2b with the second primary transmission path 212.

Here, although a sub-array has different distances from two primary transmission paths, a difference between different distances may be ignored compared with the whole transmission path of the internal and external interaction of signals, and it may be considered that a time difference of signal transmission caused by the difference may be ignored.

In this way, the first sub-array may transmit a signal to the outside through the first secondary transmission path and the first primary transmission path, or the first sub-array may transmit a signal to the outside through the second secondary transmission path and the second primary transmission path. Here, although a sub-array may transmit signal to the outside through different transmission paths, the time at which a signal reaches a specific location in the transmission path is fixed. Therefore, there is no defect of signal truncation occurring in the signal transmission process, and the signal margin can be improved.

In some embodiments, the first primary transmission path 211 has multiple connection points (such as the connection point 24-1a and the connection point 24-2a in FIG. 4), and the second primary transmission path 212 has multiple connection points (such as the connection point 24-1b and the connection point 24-2b in FIG. 4).

At least two sub-arrays in each of the storage arrays form the first secondary transmission paths relative to a connection point in the first primary transmission path 211.

At least two sub-arrays in each of the storage arrays form the second secondary transmission paths relative to a connection point in the second primary transmission path 212.

That is, for the storage array 23-1, the first sub-array 301-1 and the second sub-array 302-1 form the first secondary transmission paths 221-1a and 221-1b relative to the connection point 24-1a, respectively, and the first sub-array 301-1 and the second sub-array 302-1 form the second secondary transmission paths 222-1a and 222-1b relative to the connection point 24-1b, respectively. For the storage array 23-2, the first sub-array 301-2 and the second sub-array 302-2 form the first secondary transmission paths 221-2a and 221-1b relative to the connection point 24-2a, respectively, and the first sub-array 301-2 and the second sub-array 302-2 form the second secondary transmission path 222-2a and the second secondary transmission path 222-2b relative to the connection point 24-2b, respectively.

In this way, less number of connection points can be arranged, and the rationality of circuit layout can be improved. Also, the length of the secondary transmission path between the first sub-array and one of the first primary transmission path and the second primary transmission path may be equal to the length of the secondary transmission path between the second sub-array and the other of the first primary transmission path and the second primary transmission path. For example, the first secondary transmission path 221-1a has the same length as the second secondary transmission path 222-1b, and the first secondary transmission path 221-1b has the same length as the second secondary transmission path 222-1a. In this way, in a data writing or reading process, when the first primary transmission path is used to transmit one of upper-byte data and lower-byte data, and the second primary transmission path is used to transmit the other of the upper-byte data and the lower-byte data, the lengths of the secondary transmission paths may be the identical in the data transmission, thus further reducing or even eliminating the problem of signal truncation caused by the different lengths of the secondary transmission paths and improving the signal margin.

Figure 5:
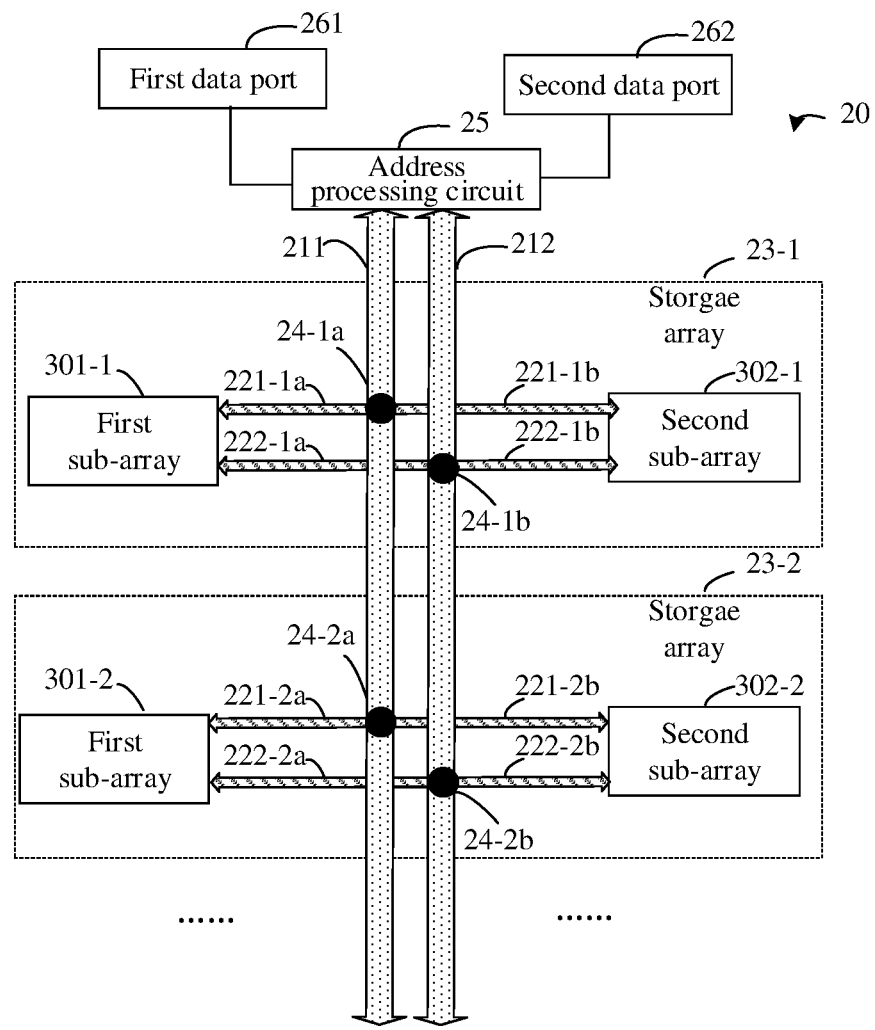
FIG. 5 is a schematic structural diagram of yet another data processing circuit provided by an embodiment of the present disclosure.

In some embodiments, based on FIG. 4, as illustrated in FIG. 5, the data processing circuit 20 may also include an address processing circuit 25, and the address processing circuit 25 is connected with a starting point of the first primary transmission path 211 and a starting point of the second primary transmission path 212 respectively.

The address processing circuit 25 is configured to perform signal transmission relative to the first sub-array through the first primary transmission path 211 and the first secondary transmission path corresponding to the first sub-array. Alternatively, the address processing circuit 25 is configured to perform signal transmission relative to the second sub-array through the second primary transmission path 212 and the second secondary transmission path corresponding to the second sub-array. Alternatively, the address processing circuit 25 is configured to perform signal transmission relative to the second sub-array through the first primary transmission path 211 and the first secondary transmission path corresponding to the second sub-array. Alternatively, the address processing circuit 25 is configured to perform signal transmission relative to the first sub-array through the second primary transmission path 212 and the second secondary transmission path corresponding to the first sub-array. Alternatively, the address processing circuit 25 is configured to perform signal transmission relative to the second sub-array through the first primary transmission path 211 and the first secondary transmission path corresponding to the second sub-array, and perform signal transmission relative to the second sub-array through the second primary transmission path 212 and the second secondary transmission path corresponding to the second sub-array. Alternatively, the address processing circuit 25 is configured to perform signal transmission relative to the second sub-array through the first primary transmission path 211 and the first secondary transmission path corresponding to the second sub-array, and perform signal transmission relative to the first sub-array through the second primary transmission path 212 and the second secondary transmission path corresponding to the first sub-array.

In the above process, the time that a signal is transmitted from a fixed location to another location is approximately fixed, thereby effectively improving the problem of signal truncation. In addition, the address processing circuit 25 may perform signal transmission relative to the first sub-array/the second sub-array by multiple flexible combinations, which can thus be applied to various data transmission situations and improve the commonality and flexibility of the data processing circuit.

It is to be noted that there are two types of signal transmission in the embodiments of the present disclosure. For the first type of signal transmission, the address processing circuit 25 performs signal transmission with only one sub-array, for example, the transmission of an 8-byte data signal. In this case, the address processing circuit 25 may perform data transmission with either the first sub-array or the second sub-array. For the second type of signal transmission, the address processing circuit 25 perform signal transmission relative to both the two sub-arrays in a storage array, for example, the transmission of a 16-byte data signal. In this case, the upper 8-byte data is transmitted to one of the first sub-array and the second sub-array, and the lower 8-byte data is transmitted to the other of the first sub-array and the second sub-array.

It is to be understood that signal transmission includes two different processes, that is, the data reading operation and the data writing operation. To facilitate illustration, the data writing operation is taken as an example. The data reading operation may be understood as an inverse process of the data writing operation, and may be understood by referring to the data writing operation.

Taking the data writing operation as an example, the address processing circuit 25 is further described below.

As illustrated in FIG. 5, in some embodiments, the address processing circuit 25 is connected with a first data port 261 and a second data port 262.

The address processing circuit 25 is further configured to transmit a signal received from the first data port 261 to one of the first primary transmission path 211 and the second primary transmission path 212, and/or transmit a signal received from the second data port 262 to the other of the first primary transmission path 211 and the second primary transmission path 212.

In this way, for the first type of data writing operation, the address processing circuit 25 may receive a signal from the first data port 261, and transmit the signal to the first primary transmission path 211 or the second primary transmission path 212. In practice, according to the different settings in the actual application scenarios, the address processing circuit 25 may also receive a signal from the second data port 262, and transmit the signal to the first primary transmission path 211 or the second primary transmission path 212.

For the second type of data writing operation, the address processing circuit 25 receives signals from both the first data port 261 and the second data port 262, transmits the signal received from the first data port 261 to the first primary transmission path 211, and transmits the signal received from the second data port 262 to the second primary transmission path 212. In practice, according to the different settings in the actual application scenarios, the address processing circuit 25 may also transmit the signal received from the first data port 261 to the second primary transmission path 212, and transmit the signal received from the second data port 262 to the first primary transmission path 211.

The signal from the first data port 261 and the signal from the second data port 262 is selected by the address processing circuit 25, and then may be distributed to any of the first sub-array and the second sub-array, which can thus be applied to various data transmission situations and improve the commonality and flexibility of the data processing circuit.

Figure 6:
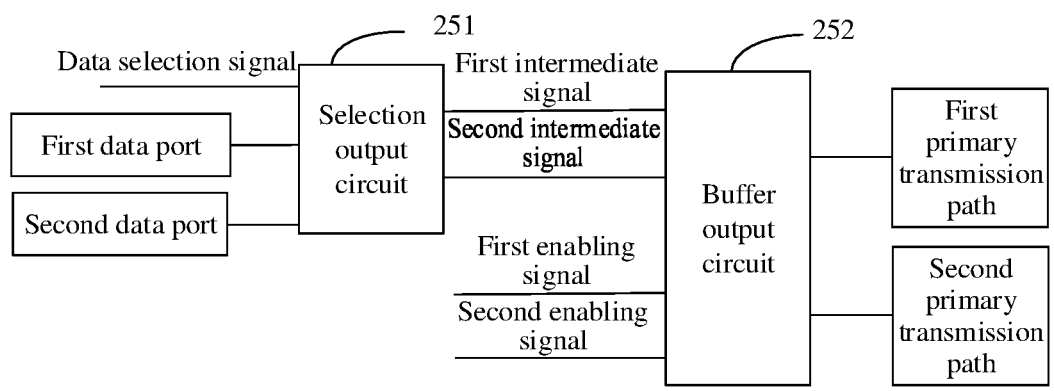
FIG. 6 is a schematic structural diagram of an address processing circuit provided by an embodiment of the present disclosure.

FIG. 6 is a schematic structural diagram of an address processing circuit 25 provided by an embodiment of the present disclosure. As shown in FIG. 6, the address processing circuit 25 may include a selection output circuit 251 and a buffer output circuit 252.

The selection output circuit 251 is configured to receive a data selection signal, and perform, according to the data selection signal, selectively output to the signal received from the first data port 261 and the signal received from the second data port 262 to obtain a first intermediate signal and a second intermediate signal.

The buffer output circuit 252 is configured to receive a first enabling signal and a second enabling signal, transmit the first intermediate signal to the first primary transmission path 211 according to the first enabling signal, and transmit the second intermediate signal to the second primary transmission path 212 according to the second enabling signal.

It is to be noted that the selection output circuit 251 is configured to perform selectively output to the signal of the first data port 261 and/or the signal of the second data port 262, to transmit the received signal to the first primary transmission path 211 and/or the second primary transmission path 212.

The buffer output circuit 252 is configured to perform buffered output.

Specifically, if the primary transmission path 21 is in a writing stage, the primary transmission path 21 is idle, and the buffer output circuit 252 directly sends the first intermediate signal/the second intermediate signal to the primary transmission path 21. If the primary transmission path 21 is in a reading stage, the primary transmission path 21 is occupied, and the buffer output circuit 252 does not output the received first intermediate signal/second intermediate signal, and outputs a high-impedance state, to block the received signal.

Figure 7:
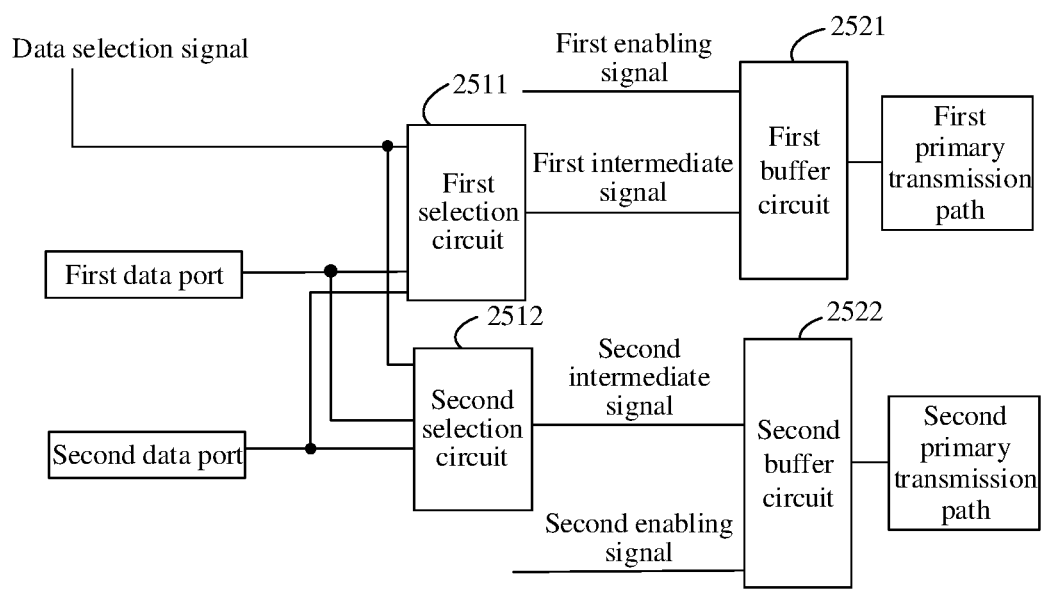
FIG. 7 is a schematic structural diagram of another address processing circuit provided by an embodiment of the present disclosure.

In an embodiment, based on FIG. 6, as illustrated in FIG. 7, the selection output circuit 251 includes a first selection circuit 2511 and a second selection circuit 2512.

The first selection circuit 2511 is configured to perform, according to the data selection signal, selectively output to the signal received from the first data port 261 and the signal received from the second data port 262 to obtain the first intermediate signal.

The second selection circuit 2512 is configured to perform, according to the data selection signal, selectively output to the signal received from the first data port 261 and the signal received from the second data port 262 to obtain the second intermediate signal.

It is to be noted that the first intermediate signal may be received from the first data port 261 or from the second data port 262. Also, the second intermediate signal may be received from the second data port 262 or from the first data port 261. In addition, in most cases, the first intermediate signal and the second intermediate signal are different data signals received from different data ports at the same time, that is, the first intermediate signal is a data signal received from one of the first data port and the second data port, and the second intermediate signal is a data signal received from the other of the first data port and the second data port.

In some embodiments, the first selection circuit 2511 is configured to output the signal received from the first data port 261 to obtain the first intermediate signal when the data selection signal is in a first level state, or output the signal received from the second data port 262 to obtain the first intermediate signal when the data selection signal is in a second level state.

The second selection circuit 2512 is configured to output the signal received from the second data port 262 to obtain the second intermediate signal when the data selection signal is in a first level state, or output the signal received from the first data port 261 to obtain the second intermediate signal when the data selection signal is in a second level state.

The first level state is different from or opposite to the second level state.

It is to be noted that in the first type of data writing operation, signals may be received from one of the first data port 261 and the second data port 262, and the other of the first data port 261 and the second data port 262 is idle. In the second type of data writing operation, the lower-byte signal is received from the first data port 261, and the upper-byte signal is received from the second data port 262.

Further, for the first type of data writing operation, the level state of the data selection signal may be determined according to an operation instruction, and then the signal from the first data port 261 is transmitted through the first intermediate signal or the second intermediate signal, to transmit the signal from the first data port 261 to the first primary transmission path 211 or the second primary transmission path 212. For the second type of data writing operation, the level state of the data selection signal may be fixed, and then the signal from the first data port 261 is received by the first intermediate signal, and the signal from the second data port 262 is received by the second intermediate signal.

Figure 8:
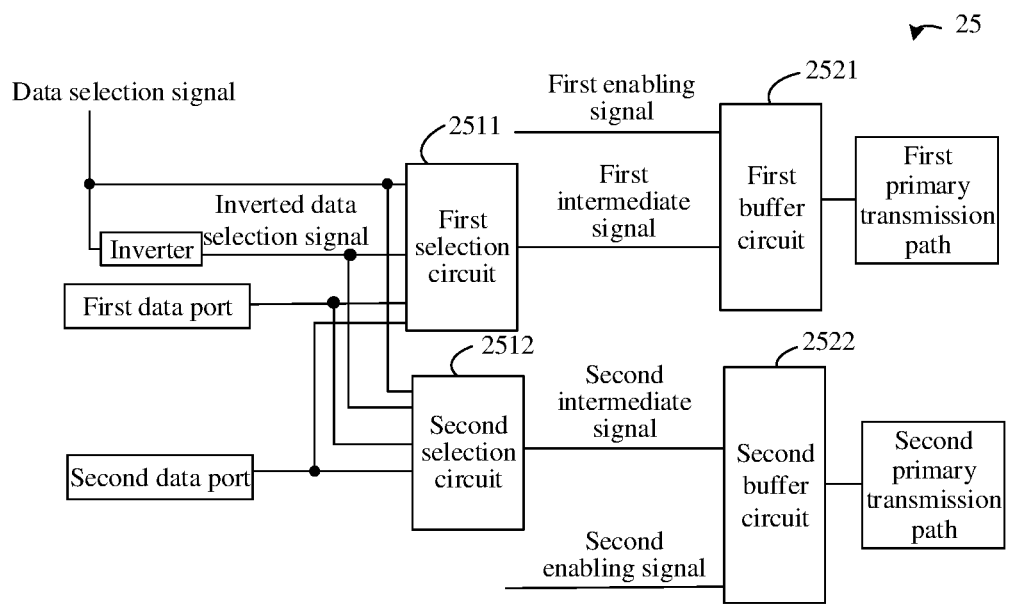
FIG. 8 is a schematic structural diagram of yet another address processing circuit provided by an embodiment of the present disclosure.

In another embodiment, based on FIG. 6, as illustrated in FIG. 8, the selection output circuit 251 may also include an inverter 2513, a first selection circuit 2511 and a second selection circuit 2512.

The inverter 2513 is configured to invert the data selection signal to obtain an inverted data selection signal.

The first selection circuit 2511 is configured to perform, according to the data selection signal and the inverted data selection signal, selectively output to the signal received from the first data port 261 and the signal received from the second data port 262 to obtain the first intermediate signal.

The second selection circuit 2512 is configured to perform, according to the inverted data selection signal and the data selection signal, selectively output to the signal received from the first data port 261 and the signal received from the second data port 262 to obtain the second intermediate signal.

It is to be noted that the selection output circuit 251 may further include an inverter 2513 configured to obtain the inverted data selection signal, Therefore, the first selection circuit 2511 and the second selection circuit 2512 perform selectively output according to data selection signal and the inverted data selection signal, so that all components which are enabled or disabled at different level signals in the first selection circuit 2511 and the second selection circuit 2512 can be effectively enabled or disabled, to realizing a preset selection function.

In some embodiments, the first selection circuit 2511 is configured to output the signal received from the first data port 261 to obtain the first intermediate signal when the data selection signal is in the first level state and the inverted data selection signal is in the second level state, or output the signal received from the second data port 262 to obtain the first intermediate signal when the data selection signal is in the second level state and the inverted data selection signal is in the first level state.

The second selection circuit 2512 is configured to output the signal received from the second data port 262 to obtain the second intermediate signal when the data selection signal is in the first level state and the inverted data selection signal is in the second level state, or output the signal received from the first data port 261 to obtain the second intermediate signal when the data selection signal is in the second level state and the inverted data selection signal is in the first level state.

In some embodiments, as illustrated in FIG. 7 or FIG. 8, the buffer output circuit 252 includes a first buffer circuit 2521 and a second buffer circuit 2522.

The first buffer circuit 2521 is connected in series between the selection output circuit and the first primary transmission path 211, and is configured to transmit the first intermediate signal to the first primary transmission path 211 when the first enabling signal is in the second level state, or block the first intermediate signal when the first enabling signal is in the first level state.

The second buffer circuit 2522 is connected in series between the selection output circuit and the second primary transmission path 212, and is configured to transmit the second intermediate signal to the second primary transmission path 212 when the second enabling signal is in the second level state, or block the second intermediate signal when the second enabling signal is in the first level state.

Exemplarily, when the primary transmission path 21 is occupied, both the first enabling signal and the second enabling signal are in the first level state, in this case, the first buffer circuit 2521 outputs a high-impedance state, and the second buffer circuit 2522 outputs a high-impedance state. When the primary transmission path is idle, both the first enabling signal and the second enabling signal are in the second level state, the first buffer circuit 2521 outputs the first intermediate signal, and the second buffer circuit 2522 outputs the second intermediate signal. Here, the high-impedance state is equivalent to circuit breaking.

It is to be noted that the foregoing takes a scenario where the first enabling signal/the second enabling signal is active low as an example, the first enabling signal/the second enabling signal may also be active high, or active levels of the first enabling signal and the second enabling signal are different, as long as the first enabling signal and the second enabling signal match the corresponding circuit structures.

In some embodiments, the first buffer circuit 2521 may include a first enabling unit and a first buffer unit. The first enabling unit is configured to receive the first enabling signal and the first intermediate signal, and transmit the first intermediate signal when the first enabling signal is in the second level state, or block the first intermediate signal when the first enabling signal is in the first level state. The first buffer unit is configured to buffer an output signal of the first enabling unit.

In some embodiments, the second buffer circuit 2522 may include a second enabling unit and a second buffer unit.

The second enabling unit is configured to receive the second enabling signal and the second intermediate signal, and transmit the second intermediate signal when the second enabling signal is in the second level state, or block the second intermediate signal when the second enabling signal is in the first level state.

The second buffer unit is configured to buffer an output signal of the second enabling unit.

It is to be noted that the first level state is a high level, the second level state is a low level, and both the first enabling signal and the second enabling signal are low level effective signal. Here, the high level and the low level are relative, and a voltage range involved is determined according to a device. For example, for an N-channel Field Effect Transistor (FET), the high level is a gate voltage range under which the transistor is turned on, and the low level is a gate voltage range under which the transistor is turned off. For a P-channel FET, the low level is a gate voltage range under which the transistor is turned on, and the high level is a gate voltage range under which the transistor is turned off.

In this way, in the data writing operation, the signal from the first data port 261 and/or the signal from the second data port 262 can be processed flexibly through the address processing circuit, and transmitted to the first primary transmission path 211 and/or the second primary transmission path 212, thereby implementing the first type of data writing operation or the second type of data writing operation.

In addition, in some embodiments, the address processing circuit 25 is further configured to transmit the signal received from the first primary transmission path 211 to one of the first data port 261 and the second data port 262, and/or, transmit the signal received from the second primary transmission path 212 to the other of the first data port 261 and the second data port 262.

It is to be noted that, to facilitate illustration, the case where data is read from only one sub-array is called first type of data reading operation, which corresponds to the first type of signal transmission. The case where data is read simultaneously from two sub-arrays is called second type of data reading operation, which corresponds to the second type of the signal transmission.

In this way, for the first type of data reading operation, the address processing circuit 25 obtains a signal from the first sub-array or the second sub-array through the first primary transmission path 211 or the second primary transmission path 212, and transmits the signal to the first data port 261. In practice, the address processing circuit 25 may also transmit the signal to the second data port 262 according to the different settings in the actual application scenarios.

For the second type of data reading operation, the address processing circuit 25 receives a signal from the first sub-array through the first primary transmission path 211, receive a signal from the second sub-array through the second primary transmission path 212, and transmit the received signals respectively to the first data port 261 and the second data port 262. Alternatively, the address processing circuit 25 may also receive a signal from the first sub-array through the second primary transmission path 212, receive a signal from the second sub-array through the first primary transmission path 211, and transmit the received signals respectively to the first data port 261 and the second data port 262.

In addition, a circuit hardware structure for data reading operation is not illustrated in the embodiments of the present disclosure. Because the data reading operation is an inverse process of the data writing operation, the circuit hardware structure of the data reading operation may be understood by referring to the circuit hardware structure designed for the data writing operation, and shall fall within the scope of protection of the embodiments of the present disclosure.

To sum up, the embodiment of the present disclosure provides a data processing circuit, which can realize signal transmission of a sub-array through the shared primary transmission path and the secondary transmission paths, and ensure that the time at which signals arrive at any specific location in the transmission path is the same, thus avoiding the problem of signal truncation and improving the signal margin. By means of the address processing circuit, the signals from the first data port and the second data port can be controlled by the data selection signal to be distributed to any of the first sub-array and the second sub-array. A variety of combinations of transmission paths are provided, thereby improving the flexibility of transmission.

Figure 9:
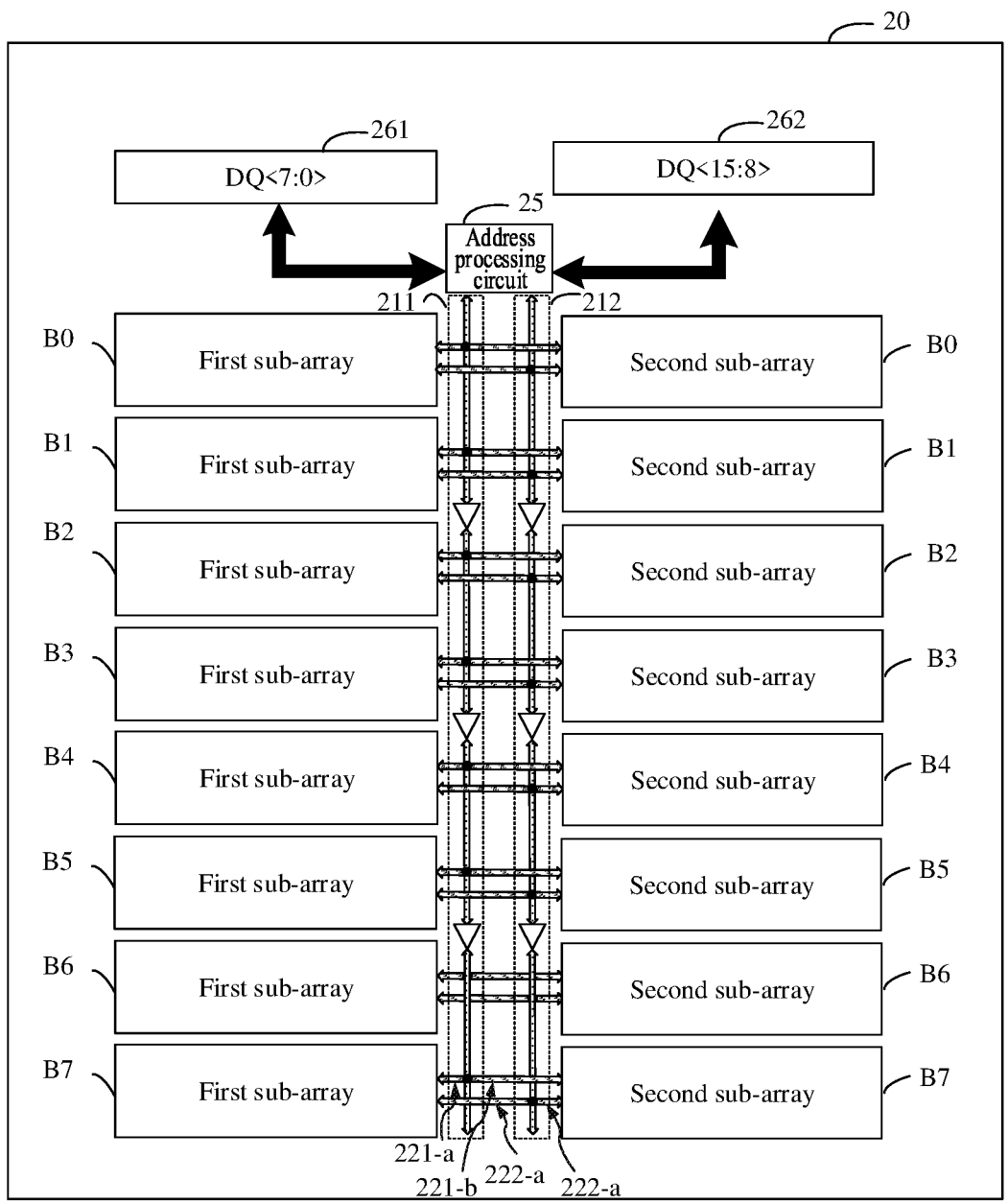
FIG. 9 is a schematic structural diagram of a data processing circuit provided by an embodiment of the present disclosure.

In another embodiment of the present disclosure, FIG. 9 is a schematic structural diagram of a data processing circuit 20 provided by the embodiment of the present disclosure.

As illustrated in FIG. 9, the data processing circuit 20 includes 8 storage arrays (B0 to B7). The 8 storage arrays are aligned in a first direction. Each storage array comprises a first sub-array and a second sub-array arranged in a second direction. That is, all the first storage sub-arrays are arranged in the first direction, and all the second storage sub-arrays are arranged in the first direction. Here, the first direction and the second direction are perpendicular to each other. In other embodiments, the first direction and the second direction may be determined according to the actual application scenarios.

The data processing circuit 20 may also include a first primary transmission path 211 and a second primary transmission path 212. The first primary transmission path 211 is parallel to the second primary transmission path 212, and both the first primary transmission path 211 and the second primary transmission path 212 extend in the first direction. The first primary transmission path 211 is arranged between the first sub-array and the second sub-array and close to the first sub-array. The second primary transmission path 212 is arranged between the first sub-array and the second sub-array and close to the second sub-array. In addition, multiple buffers are set on both the first primary transmission path 211 and the second primary transmission path 212 to improve a data transmission speed.

The data processing circuit 20 may also include a first secondary transmission path between the storage array and the first primary transmission path 211 and a second secondary transmission path between the storage array and the second primary transmission path 212. In FIG. 9, taking only the storage array B7 as an example, the first secondary transmission path and the second secondary transmission path are labeled, and other labels are omitted. Specifically, the first sub-array in the storage array B7 is connected to the first primary transmission path 211 through the first secondary transmission path 221-*a*, and connected to the second primary transmission path 212 through the second secondary transmission path 222-*a*. The second sub-array in the storage array B7 is connected to the first primary transmission path 211 through the first secondary transmission path 221-*b*, and connected to the second primary transmission path 212 through the second secondary transmission path 222-*b*.

The data processing circuit 20 may also include the address processing circuit 25, the first data port 261 and the second data port 262. The address processing circuit 25 is connected to the first data port 261, the second data port 262, the first primary transmission path 211 and the second primary transmission path 212. In addition, the first data port 261 is configured to transmit the lower-byte signal DQ<7:0>, and the second data port 262 is configured to transmit the upper-byte signal DQ<15:8>.

Taking the data writing operation as an example, the operation process of the address processing circuit 20 is described below.

For the data writing operation (equivalent to the first type of data writing operation) of a 8-byte signal, the lower-byte signal DQ<7:0> is received from one of the first data port 261 and the second data port 262, and the other is idle. In this case, the address processing circuit 25 transmits the lower-byte signal DQ<7:0> to the first primary transmission path 211 or the second primary transmission path 212, and the signal is then transmitted to the first sub-array or the second sub-array through the secondary transmission path corresponding to the first sub-array or the second sub-array.

For the data writing operation (equivalent to the second type of data writing operation) of a 16-byte signal, the lower-byte signal DQ<7:0> is received from the first data port 261, and the upper-byte signal DQ<15:8> is received from the second data port 262. In this case, the address processing circuit 25 transmits the lower-byte signal DQ<7:0> to one of the first primary transmission path 211 and the second primary transmission path 212, and then the lower-byte signal DQ<7:0> is transmitted to one of the first sub-array and the second sub-array through the secondary transmission path corresponding to one of the first sub-array and the second sub-array. Also, the upper-byte signal DQ<15:8> is transmitted to the other of the first primary transmission path 211 and the second primary transmission path 212, and then the signal is transmitted to the other of the first sub-array and the second sub-array through the secondary transmission path corresponding to the other.

In other word, the signal from the first data port 261 and the signal from the second data port 262 are selected through the address processing circuit 25, and may be distributed to any one of the first sub-array and the second sub-array. In this process, the time at which a signal arrives at a specific location in the transmission path is fixed, which can improve signal truncation during transmission and improve the signal margin.

Figure 10:
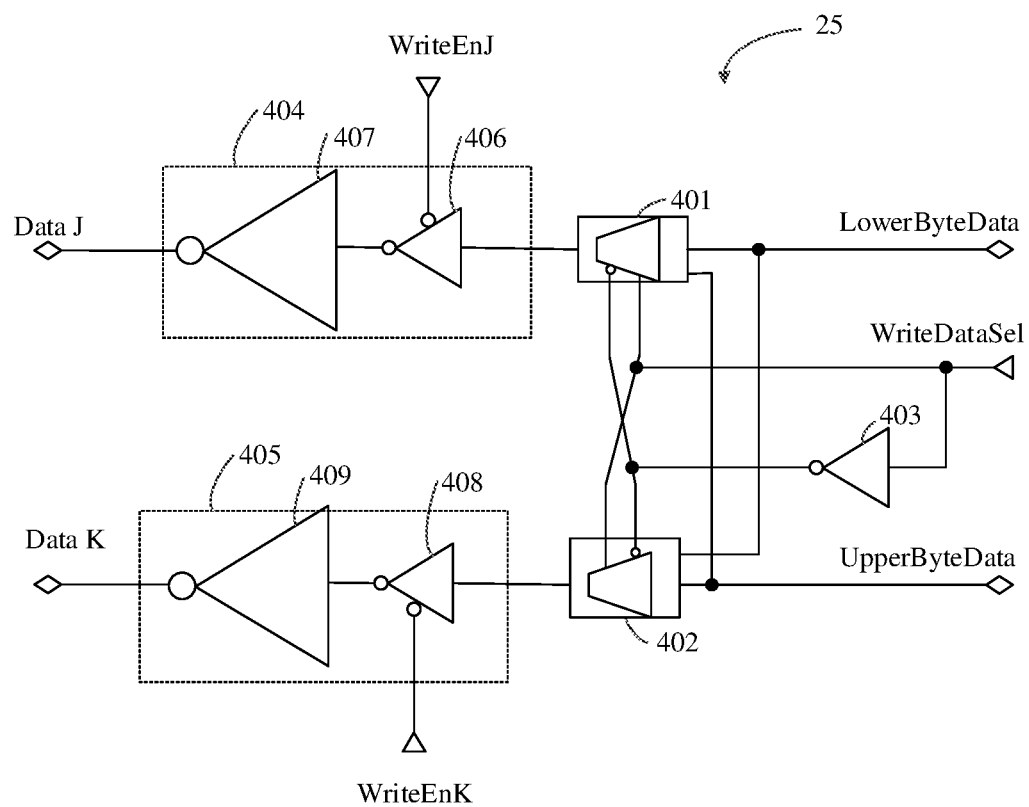
FIG. 10 is a schematic structural diagram of an address processing circuit provided by an embodiment of the present disclosure.

To achieve the above purpose, a structure of the address processing circuit 25 is given as an example. FIG. 10 is a schematic structural diagram of an address processing circuit 25 provided by an embodiment of the present disclosure. As illustrated in FIG. 10, the address processing circuit may include a one-out-of-two data selector 401, a one-out-of-two data selector 402, an inverter 403, a three-state buffer 404 and a three-state buffer 405. Here, the one-out-of-two data selector 401 is equivalent to the first selection circuit, the one-out-of-two data selector 402 is equivalent to the second selection circuit, the inverter 403 is equivalent to the inverter in the selection output circuit, the three-state buffer 404 is equivalent to the first buffer circuit, and the three-state buffer 405 is equivalent to the second buffer circuit. The first buffer circuit includes the first enabling unit 406 and the first buffer unit 407, and the second buffer circuit includes the second enabling unit 408 and the second buffer unit 409.

As illustrated in FIG. 10, the inverter 403 receives the data selection signal writeDataSel, and outputs the inverted data selection signal.

Two input ends of the one-out-of-two data selector 401 are used to receive the lower-byte signal LowerByteData and the upper-byte signal UpperByteData respectively. A control end of the one-out-of-two data selector 402 is used to receive the data selection signal writeDataSel and the inverted data selection signal respectively. When the data selection signal writeDataSel is at high level and the inverted data selection signal is at low level, the lower-byte signal LowerByteData is outputted to obtain the first intermediate signal, or when the data selection signal writeDataSel is at low level and the inverted data selection signal is at high level, the upper-byte signal UpperByteData is output to obtain the first intermediate signal.

Two input ends of the one-out-of-two data selector 402 are used to receive the lower-byte signal LowerByteData and the upper-byte signal UpperByteData respectively. A control end of the one-out-of-two data selector 402 is used to receive the inverted data selection signal and the data selection signal writeDataSel respectively. When the data selection signal writeDataSel is at high level and the inverted data selection signal is at low level, the upper-byte signal UpperByteData is output to obtain the second intermediate signal, or when the data selection signal writeDataSel is at low level and the inverted data selection signal is at high level, the lower-byte signal LowerByteData is output to obtain the second intermediate signal.

An input end of the three-state buffer 404 is connected to an output end of the one-out-of-two data selector 401 for receiving the first intermediate signal, and a control end of the three-state buffer 404 is connected to the first enabling signal WriteEnJ. When the first enabling signal WriteEnJ is in low level state, the first intermediate signal is transmitted and buffered, so as to transmit the first intermediate signal to the first primary transmission path 211 as a first target signal DataJ; or when the first enabling signal WriteEnJ is in high level state, a high-impedance state is output.

An input end of the three-state buffer 405 is connected to the output end of the one-out-of-two data selector 402 for receiving the second intermediate signal, and a control end of the three-state buffer 405 is connected to the second enabling signal WriteEnK. When the second enabling signal WriteEnK is in low level state, the second intermediate signal is transmitted and buffered, so as to transmit the second intermediate signal to the second primary transmission path 212 as a second target signal DataK; or when the second enabling signal WriteEnK is in high level state, a high-impedance state is output.

Finally, according to the specific operation instructions, the first target signal DataJ and/or the second target signal DataK reaches the sub-arrays through the secondary transmission paths corresponding to the sub-arrays to implement the data writing operation.

The embodiments of the present disclosure provide a data processing circuit. It can be seen from the detailed description of the above embodiments, through the data processing circuit, the time at which a signal arrives at a specific location in the transmission path is fixed, which can avoid the problem of the arriving time of data are different in the traditional structures, thereby overcoming the defect of signal truncation in transmission, avoiding the problem of data sampling failure, and improving the signal margin. In addition, by means of the address processing circuit, the signals from the first data port and the second data port can be controlled by the data selection signal to be distributed to any of the first sub-array and the second sub-array. A variety of combinations of transmission paths are provided, thereby improving the flexibility of transmission.

Figure 11:
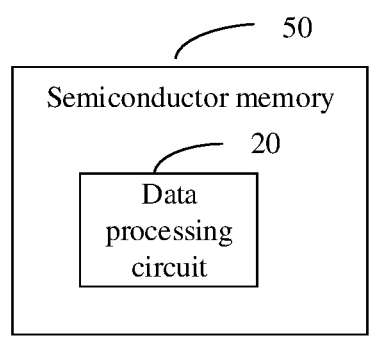
FIG. 11 is a composition structure diagram of a semiconductor memory provided by an embodiment of the present disclosure.

In yet another embodiment of the present disclosure, FIG. 11 is a schematic composition structure diagram of a semiconductor memory provided by an embodiment of the present disclosure. As illustrated in FIG. 11, the semiconductor memory 50 may include the data processing circuit 20 described in any above embodiment.

In this way, for the semiconductor memory 50, the time at which a signal arrives at a specific location in the transmission path is fixed with the structure of the data processing circuit, which can improve the problem of signal truncation in transmission and improve the signal margin.

An embodiment of the present disclosure provides a data processing circuit and a semiconductor memory. The data processing circuit includes a primary transmission path, multiple secondary transmission paths and multiple storage arrays. The multiple storage arrays share the primary transmission path. Each storage array includes at least two sub-arrays, and the secondary transmission path is formed between each sub-array and the primary transmission path, and the sub-array transmits a signal through the secondary transmission path and the primary transmission path. In this way, the time at which a signal reaches a specific location in the transmission path is fixed, which can improve the conflict problem during signal transmission and improve the signal margin.

The foregoing is only the preferred embodiments of the disclosure and not intended to limit the protection scope of the disclosure.

It is to be noted that terms "include" and "contain" or any other variant in the present disclosure is intended to cover nonexclusive inclusions herein, so that a process, method, object or device including a series of components not only includes those components but also includes other components which are not clearly listed or further includes components intrinsic to the process, the method, the object or the device. Under the condition of no more limitations, a component defined by the statement "including a/an . . . " does not exclude existence of the same other components in a process, method, object or device including the component.

The sequence numbers of the embodiments of the present disclosure are adopted not to represent superiority-inferiority of the embodiments but only for description.

The methods disclosed in some method embodiments provided in the disclosure may be freely combined without conflicts to obtain new method embodiments.

The characteristics disclosed in some product embodiments provided in the disclosure may be freely combined without conflicts to obtain new product embodiments.

The characteristics disclosed in some method or device embodiments provided in the disclosure may be freely combined without conflicts to obtain new method embodiments or device embodiments.

What is claimed is:

1. A data processing circuit, applied to memory, comprising a primary transmission path, a plurality of secondary transmission paths and a plurality of storage arrays, wherein the plurality of storage arrays share the primary transmission path,
   each of the plurality of storage arrays comprises at least two sub-arrays, and the secondary transmission path is formed between each sub-array and the primary transmission path, and the sub-array transmits a data signal through the secondary transmission path corresponding to the sub-array and the primary transmission path;
   wherein each of the plurality of storage arrays comprises a first sub-array and a second sub-array, and the primary transmission path passes through an intermediate area between the first sub-array and the second sub-array,
   the primary transmission path comprises a first primary transmission path and a second primary transmission path, the first primary transmission path is close to the first sub-array, and the second primary transmission path is close to the second sub-array, and
   the secondary transmission path comprise a first secondary transmission path and a second secondary transmission path, wherein the secondary transmission path connected with the first primary transmission path is defined as the first secondary transmission path, and the secondary transmission path connected with the second primary transmission path is defined as the second secondary transmission path, the first secondary transmission path includes the path between the first sub-array and the first primary transmission path and the path between the second sub-array and the first primary transmission path, the second secondary transmission path includes the path between the first sub-array and the second primary transmission path and the path between the second sub-array and the second primary transmission path.

2. The data processing circuit of claim 1, wherein the first primary transmission path has a plurality of connection points, and the second primary transmission path has a plurality of connection points,
   at least two sub-arrays in each of the storage arrays form the first secondary transmission paths relative to the connection point in the first primary transmission path corresponding to the at least two sub-arrays; and
   at least two sub-arrays in each of the storage arrays form the second secondary transmission paths relative to the connection point in the second primary transmission path corresponding to the at least two sub-arrays.

3. The data processing circuit of claim 2, further comprising an address processing circuit, wherein the address processing circuit is connected with the first primary transmission path and the second primary transmission path; wherein,
   the address processing circuit is configured to:
   perform data signal transmission relative to the first sub-array through the first primary transmission path and the first secondary transmission path corresponding to the first sub-array; or,
   perform data signal transmission relative to the second sub-array through the second primary transmission path and the second secondary transmission path corresponding to the second sub-array; or
   perform data signal transmission relative to the second sub-array through the first primary transmission path and the first secondary transmission path corresponding to the second sub-array; or
   perform data signal transmission relative to the first sub-array through the second primary transmission path and the second secondary transmission path corresponding to the first sub-array; or
   perform data signal transmission relative to the first sub-array through the first primary transmission path and the first secondary transmission path corresponding to the first sub-array, and perform data signal transmission relative to the second sub-array through the second primary transmission path and the second secondary transmission path corresponding to the second sub-array; or
   perform data signal transmission relative to the second sub-array through the first primary transmission path and the first secondary transmission path corresponding to the second sub-array, and perform data signal transmission relative to the first sub-array through the second primary transmission path and the second secondary transmission path corresponding to the first sub-array.

4. The data processing circuit of claim 3, wherein the address processing circuit is connected with a first data port and a second data port; wherein
the address processing circuit is further configured to perform at least one of:
transmitting a data signal received from the first data port to one of the first primary transmission path and the second primary transmission path, or
transmitting a data signal received from the second data port to the other of the first primary transmission path and the second primary transmission path.

5. The data processing circuit of claim 4, wherein the address processing circuit comprises a selection output circuit and a buffer output circuit; wherein
the selection output circuit is configured to receive a data selection signal, and in response to the data selection signal, selectively output the data signal received from the first data port and the data signal received from the second data port to obtain a first intermediate signal and a second intermediate signal;
the buffer output circuit is configured to receive a first enabling signal and a second enabling signal, transmit the first intermediate signal to the first primary transmission path according to the first enabling signal, and transmit the second intermediate signal to the second primary transmission path according to the second enabling signal.

6. The data processing circuit of claim 5, wherein the selection output circuit comprises a first selection circuit and a second selection circuit; wherein,
the first selection circuit is configured to selectively output, in response to the data selection signal, the data signal received from the first data port and the data signal received from the second data port to obtain the first intermediate signal; and
the second selection circuit is configured to selectively output, in response to the data selection signal, the data signal received from the first data port and the data signal received from the second data port to obtain the second intermediate signal.

7. The data processing circuit of claim 5, wherein the selection output circuit comprises an inverter, a first selection circuit and a second selection circuit; wherein
the inverter is configured to invert the data selection signal to obtain an inverted data selection signal;
the first selection circuit is configured to selectively output, in response to the data selection signal and the inverted data selection signal, the data signal received from the first data port and the data signal received from the second data port to obtain the first intermediate signal;
the second selection circuit is configured to selectively output, in response to the data selection signal and the inverted data selection signal, the data signal received from the first data port and the data signal received from the second data port to obtain the second intermediate signal.

8. The data processing circuit of claim 6, wherein,
the first selection circuit is configured to output the data signal received from the first data port to obtain the first intermediate signal when the data selection signal is in a first level state, or output the data signal received from the second data port to obtain the first intermediate signal when the data selection signal is in a second level state;
the second selection circuit is configured to output the data signal received from the second data port to obtain the second intermediate signal when the data selection signal is in the first level state, or output the data signal received from the first data port to obtain the second intermediate signal when the data selection signal is in the second level state;
wherein the first level state is opposite to the second level state.

9. The data processing circuit of claim 5, wherein the buffer output circuit comprises a first buffer circuit and a second buffer circuit; wherein,
the first buffer circuit is connected in series between the selection output circuit and the first primary transmission path, and is configured to transmit the first intermediate signal to the first primary transmission path when the first enabling signal is in a second level state, or block the first intermediate signal when the first enabling signal is in a first level state; and
the second buffer circuit is connected in series between the selection output circuit and the second primary transmission path, and is configured to transmit the second intermediate signal to the second primary transmission path when the second enabling signal is in the second level state, or block the second intermediate signal when the second enabling signal is in the first level state.

10. The data processing circuit of claim 9, wherein the first buffer circuit comprises a first enabling unit and a first buffer unit; wherein,
the first enabling unit is configured to receive the first enabling signal and the first intermediate signal, and transmit the first intermediate signal when the first enabling signal is in the second level state, or block the first intermediate signal when the first enabling signal is in the first level state;
the first buffer unit is configured to buffer an output signal of the first enabling unit.

11. The data processing circuit of claim 9, wherein the second buffer circuit comprises a second enabling unit and a second buffer unit; wherein,
the second enabling unit is configured to receive the second enabling signal and the second intermediate signal, and transmit the second intermediate signal when the second enabling signal is in the second level state, or block the second intermediate signal when the second enabling signal is in the first level state;
the second buffer unit is configured to buffer an output signal of the second enabling unit.

12. The data processing circuit of claim 8, wherein the first level state is high level, and the second level state is low level;
both the first enabling signal and the second enabling signal are low level active signal.

13. The data processing circuit of claim 4, wherein,
the address processing circuit is further configured to transmit the data signal received from the first primary transmission path to one of the first data port and the second data port, and/or, transmit the data signal received from the second primary transmission path to the other of the first data port and the second data port.

14. A semiconductor memory, comprising the data processing circuit, wherein the data processing circuit comprises a primary transmission path, a plurality of secondary transmission paths and a plurality of storage arrays, wherein the plurality of storage arrays share the primary transmission path,
- each of the plurality of storage arrays comprises at least two sub-arrays, and the secondary transmission path is formed between each sub-array and the primary transmission path, and the sub-array transmits a data signal through the secondary transmission path corresponding to the sub-array and the primary transmission path;
- wherein each of the plurality of storage arrays comprises a first sub-array and a second sub-array, and the primary transmission path passes through an intermediate area between the first sub-array and the second sub-array,
- the primary transmission path comprises a first primary transmission path and a second primary transmission path, the first primary transmission path is close to the first sub-array, and the second primary transmission path is close to the second sub-array, and
- the secondary transmission path comprise a first secondary transmission path and a second secondary transmission path, wherein the secondary transmission path connected with the first primary transmission path is defined as the first secondary transmission path, and the secondary transmission path connected with the second primary transmission path is defined as the second secondary transmission path, the first secondary transmission path includes the path between the first sub-array and the first primary transmission path and the path between the second sub-array and the first primary transmission path, the second secondary transmission path includes the path between the first sub-array and the second primary transmission path and the path between the second sub-array and the second primary transmission path.

15. The semiconductor memory of claim 14, wherein the first primary transmission path has a plurality of connection points, and the second primary transmission path has a plurality of connection points,
- at least two sub-arrays in each of the storage arrays form the first secondary transmission paths relative to the connection point in the first primary transmission path corresponding to the at least two sub-arrays; and
- at least two sub-arrays in each of the storage arrays form the second secondary transmission paths relative to the connection point in the second primary transmission path corresponding to the at least two sub-arrays.

16. The semiconductor memory of claim 15, further comprising an address processing circuit, wherein the address processing circuit is connected with the first primary transmission path and the second primary transmission path; wherein,
- the address processing circuit is configured to:
- perform data signal transmission relative to the first sub-array through the first primary transmission path and the first secondary transmission path corresponding to the first sub-array; or,
- perform data signal transmission relative to the second sub-array through the second primary transmission path and the second secondary transmission path corresponding to the second sub-array; or
- perform data signal transmission relative to the second sub-array through the first primary transmission path and the first secondary transmission path corresponding to the second sub-array; or
- perform data signal transmission relative to the first sub-array through the second primary transmission path and the second secondary transmission path corresponding to the first sub-array; or
- perform data signal transmission relative to the first sub-array through the first primary transmission path and the first secondary transmission path corresponding to the first sub-array, and perform data signal transmission relative to the second sub-array through the second primary transmission path and the second secondary transmission path corresponding to the second sub-array; or
- perform data signal transmission relative to the second sub-array through the first primary transmission path and the first secondary transmission path corresponding to the second sub-array, and perform data signal transmission relative to the first sub-array through the second primary transmission path and the second secondary transmission path corresponding to the first sub-array.

17. The semiconductor memory of claim 16, wherein the address processing circuit is connected with a first data port and a second data port; wherein
- the address processing circuit is further configured to perform at least one of:
- transmitting a data signal received from the first data port to one of the first primary transmission path and the second primary transmission path, or
- transmitting a data signal received from the second data port to the other of the first primary transmission path and the second primary transmission path.

18. The semiconductor memory of claim 17, wherein the address processing circuit comprises a selection output circuit and a buffer output circuit; wherein
- the selection output circuit is configured to receive a data selection signal, and in response to the data selection signal, selectively output the data signal received from the first data port and the data signal received from the second data port to obtain a first intermediate signal and a second intermediate signal;
- the buffer output circuit is configured to receive a first enabling signal and a second enabling signal, transmit the first intermediate signal to the first primary transmission path according to the first enabling signal, and transmit the second intermediate signal to the second primary transmission path according to the second enabling signal.

* * * * *